United States Patent

Uchida et al.

[11] Patent Number: 6,056,817
[45] Date of Patent: May 2, 2000

[54] PROCESS FOR PRODUCING SEMI-INSULATING INP SINGLE CRYSTAL AND SEMI-INSULATING INP SINGLE CRYSTAL SUBSTRATE

[75] Inventors: Masayuki Uchida; Osamu Oda, both of Toda, Japan

[73] Assignee: Japan Energy Corporation, Tokyo, Japan

[21] Appl. No.: 08/823,684

[22] Filed: Mar. 25, 1997

[30] Foreign Application Priority Data

Mar. 28, 1996 [JP] Japan ............................ 8-073643
Feb. 19, 1997 [JP] Japan ............................ 9-034618

[51] Int. Cl.⁷ ........................................ C30B 1/10
[52] U.S. Cl. ...................... 117/4; 117/2; 117/3; 117/5; 117/6; 117/952
[58] Field of Search ........................ 117/2, 3, 4, 5, 117/6, 952

[56] References Cited

U.S. PATENT DOCUMENTS 4,601,888   7/1986   Besomi et al. .................. 117/906
5,493,985   2/1996   Bliss et al. ..................... 117/83

FOREIGN PATENT DOCUMENTS 8-109100   4/1996   Japan ........................ 117/5

*Primary Examiner*—Robert Kunemund
*Attorney, Agent, or Firm*—Birch, Stewart, Kolasch & Birch, LLP

[57] ABSTRACT

A process for producing a semi-insulating InP single crystal and a semi-insulating InP single crystal are disclosed. The process comprises: a first step heat-treatment for heating an undoped InP single crystal having a concentration of a residual impurity of 0.05 ppmw or less containing at least one of Fe, Co and Cr, at a temperature of not less than 930° C. and less than 1000° C. in an atmosphere of phosphorous vapor pressure in the ampoule which is not less than a dissociation pressure of InP in equilibrium at the temperature and which is not more than 15 atm; and a second step heat-treatment for thereafter heating the InP single crystal at a temperature of not less than 662° C. and less than 900° C. in an atmosphere of phosphorous vapor pressure in the ampoule which is not less than 5 atm nor more than 50 atm. The semi-insulating InP single crystal substrate has a uniformity of mobility not more than 10% on the surface of the substrate.

8 Claims, 7 Drawing Sheets

PROCESS FOR PRODUCING SEMI-INSULATING INP SINGLE CRYSTAL AND SEMI-INSULATING INP SINGLE CRYSTAL SUBSTRATE

BACKGROUND OF THE INVENTION

1. Field of the Invention

The present invention relates to a process for producing a semi-insulating compound semiconductor used in electronic devices, for example, OEICs (i.e., optoelectronic IC), HEMTs (i.e., high electron mobility transistor), ion implanted FETs (i.e., field effect transistor) or the like, in particular, to a technique to semi-insulate a compound semiconductor by a heat-treatment.

2. Description of Related Art

For making a III-V compound semiconductor crystal including Si or S as shallow donors, high-resistive, i.e., semi-insulative, to have a resistivity of not less than $10^6$ $\Omega$·cm, a process of adding Fe, Co, Cr or the like as deep acceptors to the crystal has been industrially used. The semi-insulation is based on a mechanism in which deep acceptors compensate shallow donors. Therefore, it has been believed that the added amount of an element which acts as a deep acceptor must be larger than the content of shallow donors in the crystal in order to semi-insulate the crystal.

However, the amount of Fe, Co, Cr or the like doping the compound semiconductor crystals for semi-insulation is preferred to be as small as possible. The reason of this is that Fe, Co, Cr and the like serve as deep acceptors in ion implanted electronic devices, e.g., an FET, and they reduce the activation efficiency of ion implanted donor-type impurities therein. In the case of devices operating at high frequencies such as an OEIC, HEMT or the like, these elements such as Fe, Co, Cr and the like diffuse in the epitaxial layers, trap carriers, and deteriorate high-frequency and high-speed performances. In addition, these elements such as Fe and the like easily segregate so that the concentrations thereof differ in upper and lower portions of the compound semiconductor crystals, resulting in the nonuniformity of activation efficiency of implanted ion over the crystal, and therefore resulting in low yields of electronic devices based on these substrates.

Conventionally, for example, Fe doped InP single crystals have been used for semi-insulating InP single crystal substrates. When the concentration of Fe or the like in InP single crystal is less than 0.2 ppmw, the resistivity is reduced to below $10^6$ $\Omega$·cm and the semi-insulation deteriorates. In order to obtain semi-insulating crystals, Fe or the like had to be doped with more than a predetermined concentration, that is, not less than 0.2 ppmw. Generally, it has been believed that a reduced concentration of Fe, Cr and the like in the III-V compound semiconductor reduces the resistivity of the compound semiconductor because the concentration of the impurity elements, i.e., residual impurity, providing a shallow donor amounts to a level of reduced concentration of all of the Fe, Cr and the like. However, the present inventors proposed that electrically active point defects, as well as the compensation by shallow donors and deep acceptors related to impurity atoms, respectively, characterize the mechanism of semi-insulating the InP single crystal and diligently studied to discover that controlling the concentration of the point defect by means of heat-treating the single crystal caused even a much lower concentration of impurity element providing deep acceptors than a conventional concentration thereof so as to semi-insulate the III-V compound semiconductor.

The inventors previously provided a process of producing a compound semiconductor having a concentration of not more than 0.2 ppmw for the sum of at least one of Fe, Co and Cr and having a resistivity of $10^7$ $\Omega$·cm or more, as described in Japanese Patent Application Publication (Examined) No. Tokuko-hei 5-29,639. In this process, in order to treat a plurality of wafers at the same time, the wafers are aligned at approximately equal intervals in a quartz ampoule by using a jig. InP compound semiconductor wafers which were sliced from a single crystal ingot made by, e.g., the melt growth method using a melt including 0.2 ppmw or less of Fe, Co or Cr; and red phosphorus or the like are placed in the quartz ampoule which is vacuum-sealed. The quartz ampoule is heated at 400–640° C. so that the partial pressure of phosphorus in the ampoule is equal to or higher than a dissociation pressure of InP.

The present inventors further studied from the above-described process to discover that even heat-treating an undoped InP single crystal including a concentration of not more than 0.05 ppmw for the sum of the impurity elements which contain at least one of Fe, Co and Cr failed to semi-insulate the single crystal.

Thereafter, the inventors further studied and provided an improved process of producing a semi-insulating III-V compound semiconductor (InP) having a resistivity of not less than $10^6 \Omega$·cm at 300 K and a mobility of above 3,000 $cm^2$/V·s, the semiconductor having a concentration of not more than 0.05 ppmw of all the impurity elements of Fe, Co and Cr, which comprises the steps of placing and vacuum sealing both undoped InP wafers having a concentration of not more than 0.05 ppmw of all the retained impurity of Fe, Co or Cr and a predetermined amount of red phosphorus in a quartz ampoule; and heating the InP wafers under a partial pressure of phosphorus in the ampoule higher than 6 kg/$cm^2$, as described in Japanese Patent Application Publication (Laid-open) No. Tokukai-hei 3-279,299, "Semi-Insulating InP Single Crystals and Process for Producing the Same".

The improved process aims to suppress deterioration of the mobility caused by the retained impurity and to obtain a mobility higher than a predetermined value, by making the concentration of all the impurity, in particular, the sum of at least one of Fe, Co and Cr, contained in the semi-insulating III-V compound semiconductor (InP)single crystal,not more than 0.05 ppmw. The present inventors further studied the process of the Japanese Patent Application Publication (Laid-open) No. Tokukai-hei 3-279,299. As a result, it is found that according to the above process, although it is possible to obtain an InP single crystal having a higher resistivity and a higher mobility, when a plurality of InP single crystal wafers are simultaneously heat-treated, a wafer which does not have both a high resistivity and a high mobility are often produced, and therefore an InP wafer having both a higher resistivity and a higher mobility is not necessarily and stably obtained.

The inventors further studied and provided a further improved process of producing a semi-insulating InP single crystal, which comprises the steps of; heating an undoped InP single crystal including a retained impurity of at least one of Fe, Co and Cr having a concentration of not more than 0.05 ppmw under a phosphorous vapor pressure in the ampoule higher than 6 kg/$cm^2$, and thereafter further heating the single crystal at 400–640° C. under a phosphorous vapor pressure in the ampoule not less than a dissociation pressure of InP single crystal, as described in Japanese Patent Application No. Tokugan-hei 6-244,166, "Process for Producing Semi-Insulating InP Single Crystal". The present inventors further studied the process of the Japanese Patent Application No. Tokugan-hei 6-244,166. As a result, it is found that according to the above process, although it is possible to stably obtain an InP single crystal having a higher resistivity and a higher mobility, the InP single crystal obtained by the process does not reach the satisfactory level with respect to the uniformity of resistivity and the uniformity of mobility in the wafer, and therefore the process admits of improvement for the uniformity of electrical properties in the wafer.

The inventors previously reported the results of studies with respect to a heat-treatment in a phosphorous atmosphere with a low phosphorous vapor pressure, i.e., a phosphorous pressure of 1 atm, as shown in "Pro. of 7th Conf. on InP and Related materials, Sapporo. p37–40 (1995)". In the report, although the uniformity of resistivity in the wafer of 24% is shown, the uniformity of resistivity and that of mobility in the wafer will further deteriorate in a heat-treatment on an industrial scale, and therefore the results do not reach the satisfactory level either.

A conventional technique for for obtaining a uniform property in a compound semiconductor single crystal wafer by performing 2 step heat-treatments is disclosed in Japanese Patent Application Publication (Laid-open) No. Tokukai-sho 62-226,900. The technique comprises a first step of heat-treatment at an annealing temperature of 0.85–0.9 times the melting point of the grown crystal, which corresponds to 861–928° C. for InP, and a second step of heat-treatment at an annealing temperature of 0.7–0.75 times the melting point of the grown crystal, which corresponds to 661–728° C. for InP. However, the effect according to the technique is different from that of the present invention because of the difference between the first annealing temperatures. That is, the technique of the Japanese Publication provides a uniform single crystal because the intensity of photo-luminescence is merely stable, and consequently, it is possible to obtain only the effect of good uniformity of various types of properties of the wafer which is produced from the single crystal. The Japanese Publication does not disclose the effects of uniformity of mobility and that of resistivity in the InP single crystal wafer, i.e., of not more than 10%, and of not more than 20%, respectively, which are obtained by the present invention.

Another conventional technique for obtaining a uniform electrical property on the surface of a compound semiconductor single crystal wafer by a heat-treatment is disclosed in Japanese Patent Application Publication (Laid-open) No. Tokukai-hei 2-120,300. The technique comprises the steps of; heat-treating a grown single crystal at 800–1200° C., and thereafter cooling the single crystal to the room temperature with 2-steps of different cooling rates; and therefore is essentially different from the present invention comprising two annealing steps. The effect according to the technique is also different from that of the present invention, that is, the technique enables only considerably uniforming the threshold value of an FET formed on a substrate. The Japanese Publication does not disclose the effects of uniformity of mobility and that of resistivity in the InP single crystal wafer, i.e., of not more than 10%, and of not more than 20%, respectively, which are obtained by the present invention.

Another conventional technique in which two steps of heat-treatments are carried out to a compound semiconductor single crystal wafer is disclosed in Japanese Patent Application Publication (Laid-open) No. Tokukai-hei 2-192, 500 by the Applicant. The technique comprises a first step of heat-treatment at an annealing temperature of more than 1100° C. and less than the melting point of the grown single crystal, and a second step of heat-treatment at an annealing temperature of 750–1100° C., in order to obtain a wafer having a small number of micro defects (AB pits) which are generated by an AB-etching. The annealing temperature for the first step heat-treatment in this technique is quite different from that of the present invention and the technique is essentially different from the present invention.

Another conventional heat-treatment technique in which heating and cooling are repeatedly carried out two times or more at temperatures between an upper limit temperature Th which is not less than 800° C. nor more than the melting point of the grown single crystal and a lower limit temperature Tl which is not less than 800° C. nor more than the Th, is disclosed in Japanese Patent Application Publication (Laid-open) No. Tokukai-hei 8-119,800. However, this technique is essentially different from the present invention in that heating and cooling at temperatures between an upper limit temperature Th corresponding to the first step heat-treatment temperature and a lower limit temperature Tl corresponding to the second heat-treatment temperature are repeatedly carried out two times or more. In the present invention, the first step heat-treatment and the subsequent second step heat-treatment are not repeated. The technique is also quite different from the present invention in that the object of the technique is to prevent generation of slip-like defects when an epitaxial growth is carried out by using a wafer sliced from a single crystal ingot to which such a heat-treatment was performed.

R. Fornari et al. reported that as a result of performing heat-treatments two times at 910° C. in a vacuum atmosphere, a semi-insulating InP single crystal (Sample A-S8) having a resistivity of $4.4 \times 10^7$ $\Omega \cdot cm$ and a mobility of 3940 $cm^2/V \cdot s$ was obtained, in "Preparation and characterization of semi-insulating undoped indium phosphide" described in pages 95–100 of Materials Science and Engineering B28 (1994). However, the technique is also quite different from the present invention comprising two steps of heat-treatments under a phosphorous pressure in that heat-treatments of the technique are carried out in a vacuum atmosphere.

G. Hirt et al. reported that as a result of performing a heat-treatment at 900° C., a semi-insulating InP single crystal (annealed VGF Sample) having a resistivity of $1.4 \times 10^7$ $\Omega \cdot cm$ was obtained, in "Preparation of Homogeneous InP Substrate by VGF-Growth and Wafer Annealing" described in pages 37–40 of Pro. of 7th Conf. on InP and Related Materials, Sapporo (1995). However, the technique is also essentially different from the present invention comprising two steps of heat-treatments.

SUMMARY OF THE INVENTION

An object of the present invention is to provide a process for producing a semi-insulating InP single crystal which has good uniformity of resistivity and that of mobility in the InP single crystal wafer.

Another object of the present invention is to provide a semi-insulating InP single crystal wafer which has both a uniformity of mobility equal to or less than 10% in the wafer and a uniformity of resistivity equal to or less than 20% in the wafer.

To accomplish the above objects, the inventors have found that when an undoped InP single crystal is heat-treated at a high temperature in an atmosphere of low phosphorous vapor pressure and thereafter is heat-treated at a low temperature in an atmosphere of high phosphorous vapor pressure, it is possible to obtain a semi-insulating InP single crystal which has good uniformity of resistivity and that of mobility in the InP single crystal wafer.

The present invention was made on the basis of the above discoveries.

That is, in accordance with one aspect of the present invention, the process for producing a semi-insulating InP single crystal, comprises: a first step heat-treatment for heating an undoped InP single crystal having a concentration of a residual impurity of 0.05 ppmw or less containing at least one of Fe, Co and Cr, at a temperature of not less than 930° C. and less than 1000° C. in an atmosphere of phosphorous vapor pressure in the ampoule which is not less than a dissociation pressure of InP in equilibrium at the temperature and which is not more than 15 atm; and a second step heat-treatment for thereafter heating the InP single crystal at a temperature of not less than 662° C. and less than 900° C. in an atmosphere of phosphorous vapor pressure in the ampoule which is not less than 5 atm. Preferably, the phosphorous vapor pressure in the second step heat-treatment is not more than 50 atm.

In the present invention, the phosphorous vapor pressure in the first step heat-treatment is preferably more than 0.5 atm and less than 10 atm, more preferably, more than 1.0 atm and less than 5 atm. Preferably, the phosphorous vapor pressure in the second step heat-treatment is not less than 15 atm nor more than 50 atm.

An example of the dissociation pressure of InP is shown in FIG. 8 on page 138 of "THE P-T-x PHASE DIAGRAMS OF THE SYSTEM In-As, Ga-As AND In-P" in pages 127–140 of Philips Research Report, Vol. 12 (1957). The dissociation pressure of InP can be determined by using the left line or by extrapolating the line in FIG. 8.

The reason for the heat-treatment temperature of not less than 930° C. and less than 1000° C. in the first step heat-treatment is that a heat-treatment temperature of less than 930° C. does not semi-insulate InP single crystal and a heat-treatment temperature of not less than 1000° C. decomposes InP. The reason for the phosphorous vapor pressure in the ampoule which is not less than a dissociation pressure of InP in equilibrium at the heat-treatment temperature and which is not more than 15 atm, in the first step heat-treatment is that the phosphorous vapor pressure of less than the dissociation pressure of InP decomposes InP and the phosphorous vapor pressure of more than 15 atm generates noticeable contamination by Fe, Co, Cr, Ni or the like.

The reason for the heat-treatment temperature of not less than 662° C. and less than 900° C. in the second step heat-treatment is that although a heat-treatment temperature of less than 662° C. will not make a considerable unfavorable property, a heat-treatment temperature of less than 620° C. is not practical because of requiring much time for heat-treatment, and a heat-treatment temperature of not less than 900° C. does not give the effect of uniformities because of having a higher equilibrium defect concentration. The reason for the phosphorous vapor pressure of not less than 5 atm in the second step heat-treatment is that the phosphorous vapor pressure of less than 5 atm gives a uniformity of mobility more than 10% in the wafer. The reason for the preferable phosphorous vapor pressure of not more than 50 atm in the second step heat-treatment is that the phosphorous vapor pressure of more than 50 atm lowers the industrial productivity of the process. The reason for the preferable phosphorous vapor pressure of not less than 15 atm nor more than 50 atm, in the second step heat-treatment is that the phosphorous vapor pressure of less than 15 atm gives a uniformity of resistivity more than 20% in the wafer.

According to the above process, the first step heat-treatment activates a trace amount of Fe in the InP single crystal while suppressing contamination of impurities, e.g., Ni, Co and the like, and reduces the concentration of shallow donors relating to P vacancy to semi-insulate the InP single crystal. Then, the second step heat-treatment further reduces the shallow donors retained in the InP single crystal to obtain more uniform the resistivity of the InP single crystal in the wafer.

In accordance with another aspect of the present invention, the process for producing a semi-insulating InP single crystal, comprises: a first step heat-treatment for heating an undoped InP single crystal having a concentration of a residual impurity of 0.05 ppmw or less containing at least one of Fe, Co and Cr, at a temperature of not less than 930° C. and less than 1000° C. in an atmosphere of phosphorous vapor pressure in the ampoule which is not less than a dissociation pressure of InP in equilibrium at the temperature and which is not more than 15 atm for not less than 20 hours; and a second step heat-treatment for thereafter heating the InP single crystal at a temperature of not less than 662° C. and less than 900° C. in an atmosphere of phosphorous vapor pressure in the ampoule which is not less than 5 atm for not less than 6 hours.

The reason for the heat-treatment time of not less than 20 hours in the first step heat-treatment is that a heat-treatment time less than 20 hours does not often semi-insulate InP, and the reason for the preferable heat-treatment time of not less than 6 hours in the second step heat-treatment is that a heat-treatment time less than 6 hours does not improve the uniformity of resistivity in a wafer. Preferably, the heat-treatment time in the first step and second step heat-treatments is not more than 40 hours because a heat-treatment more than 40 hours lowers the industrial productivity of the process.

In accordance with another aspect of the present invention, the semi-insulating InP single crystal substrate has a uniformity of mobility not more than 10% in the wafer. Preferably, the semi-insulating InP single crystal substrate further has a uniformity of resistivity not more than 20% in the wafer.

The above-described "uniformity of mobility in a wafer" or "uniformity of resistivity in a wafer" means the percentage of the standard deviation of the obtained value of mobility or resistivity to the average value when the mobility or resistivity on a portion of the wafer except the peripheral portion having a width of 5 mm was measured at equal intervals along a particular direction passing through the central portion of the wafer. That is, when data y1, y2, y3, . . . , and yn are obtained, the uniformity is represented by the following equation:

$$\left[\left\{\sum_{i=1}^{n}(yi-y_{av})^2/(n-1)\right\}^{1/2}\right]/y_{av}\times 100\ (\%),$$

wherein $y_{av}$ denotes the average value of the data y1, y2, y3, . . . , and yn.

BRIEF DESCRIPTION OF THE DRAWINGS

The present invention will become more fully understood from the detailed description given hereinbelow and the accompanying drawings which are given by way of illustration only, and thus are not intended as a definition of the limits of the present invention, and wherein.

PREFERRED EMBODIMENT OF THE INVENTION

Embodiments of a process for producing a semi-insulating compound semiconductor and a semi-insulating compound semiconductor substrate, according to the present invention will be explained with reference to the drawings. The process for producing a semi-insulating compound semiconductor according to the present invention comprises a first step heat-treatment and a second step heat-treatment, as follows.

Figure 1:
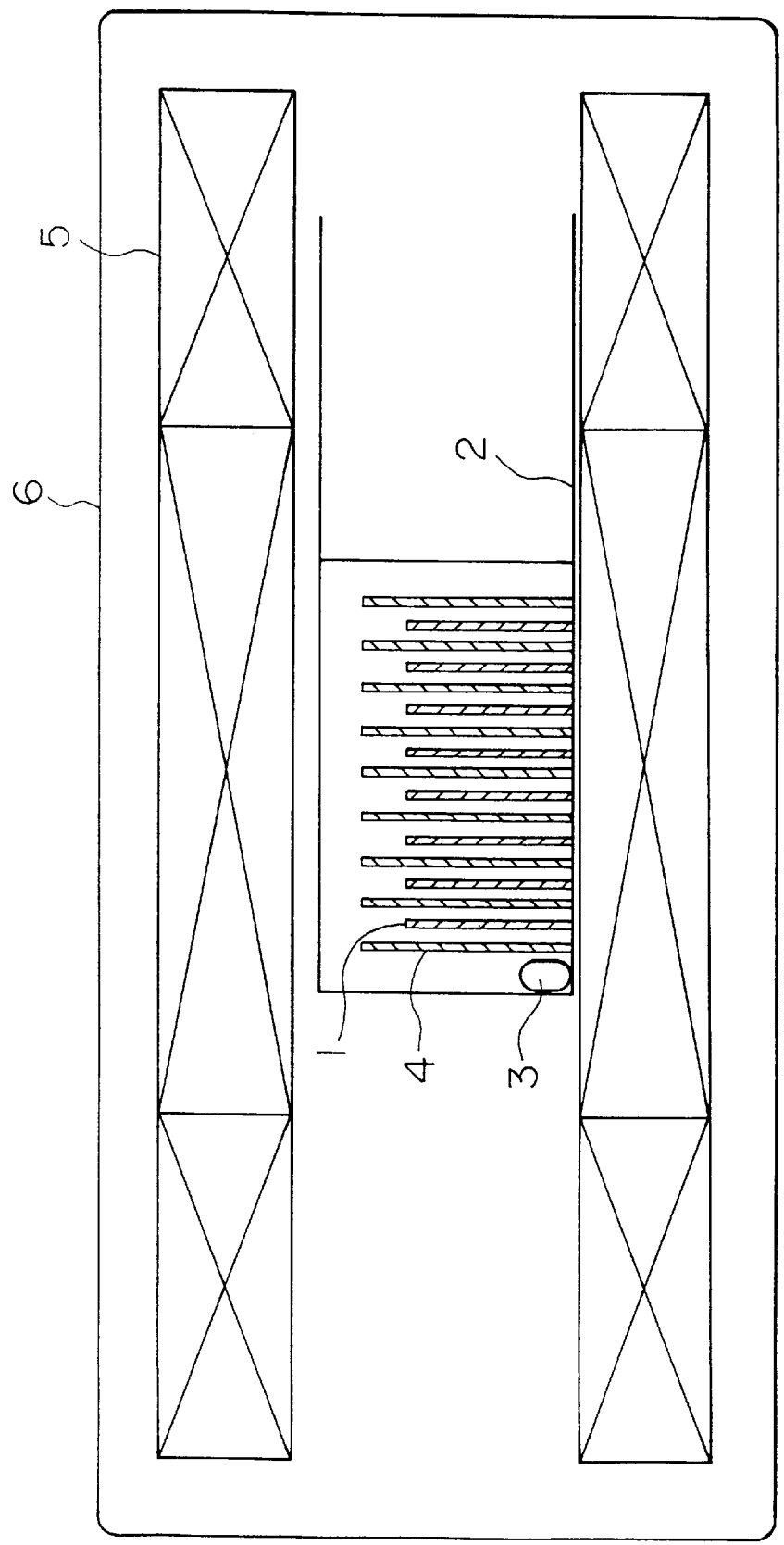
FIG. 1 is a schematic view showing a state of InP wafers set in a furnace which is used for producing a semi-insulating InP single crystal.

First Step Heat-treatment:

First, a plurality of wafers 1 sliced from an InP single crystal ingot which has a concentration of a residual impurity of not more than 0.05 ppmw containing at least one of Fe, Co and Cr, are prepared and aligned at approximately equal intervals in a quartz ampoule 2 by using a jig 4 made of quartz which acts as spacers, as shown in FIG. 1. Proper amounts of red phosphorus 3 having a high purity are placed in the quartz ampoule 2 and a gas in the ampoule is evacuated. The amount of the red phosphorus 3 is adjusted so that the phosphorous vapor pressure in the ampoule is not less than a dissociation pressure of InP in equilibrium at the heat-treatment (annealing) temperature and which is not more than 15 atm. Thereafter, the open end of the quartz ampoule 2 is melted by an oxyhydrogen burner to seal the quartz ampoule. Then, the quartz ampoule 2 is set in a horizontal furnace 6, heated by a heater 5 and held at a temperature of not less than 930° C. and less than 1000° C., for a predetermined time.

In the first step heat-treatment, an annealing temperature of less than 930° C. does not semi-insulate InP single crystal and an annealing temperature of not less than 1000° C. decomposes InP. A phosphorous vapor pressure of less than the dissociation pressure of InP decomposes InP and a phosphorous vapor pressure of more than 15 atm does not semi-insulate InP by generation of noticeable contamination by Cr, Ni and the like. A phosphorous vapor pressure of more than 0.5 atm and less than 10 atm, preferably, of more than 1.0 atm and less than 5 atm, can reduce the uniformity of property of wafers in one lot.

Second Step Heat-treatment:

The wafers 1 in the quartz ampoule 2 are cooled to the room temperature and are taken out of the quartz ampoule 2. Thereafter, the wafers 1 and proper amounts of red phosphorus 3 having a high purity are placed in another quartz ampoule 2 and a gas in the ampoule is evacuated. The amount of the red phosphorus 3 is adjusted so that the phosphorous vapor pressure in the ampoule 2 is not less than 5 atm nor more than 50 atm. Then, the quartz ampoule 2 is set in a horizontal furnace 6, heated by a heater 5 and held at a temperature of not less than 662° C. and less than 900° C., for a predetermined time.

In the second step heat-treatment, an annealing temperature of less than 662° C., in particular, less than 620° C., requires much time and an annealing temperature of not less than 900° C. does not give the effect of uniformity of mobility in a wafer. The phosphorous vapor pressure of less than 5 atm gives a uniformity of mobility more than 10% in a wafer and the phosphorous vapor pressure of more than 50 atm lowers the industrial productivity of the process. The phosphorous vapor pressure is preferably not less than 15 atm nor more than 50 atm because the phosphorous vapor pressure of less than 15 atm gives a uniformity of resistivity more than 20% in the wafer.

Thereafter, the InP wafers 1 in the quartz ampoule 2 are cooled to the room temperature and are taken out of the quartz ampoule.

According to the above process, the InP single crystal is semi-insulated by the first step heat-treatment, and the defects retained in the InP single crystal are reduced by the second step heat-treatment, so that the resistivity in the InP single crystal wafer is unifomalized. Therefore, it is possible to obtain a semi-insulating InP single crystal which has good uniformity of resistivity and that of mobility in the wafer.

The used horizontal furnace 6 is one of closed type and can allow a pressure of up to 100 kg/cm². During temperature-increasing and cooling, an argon gas having a pressure corresponding to a phosphorous partial pressure at an increasing or cooling temperature is introduced into the furnace 6 in order to maintain a pressure balance inside and outside the quartz ampoule 2 and avoid a breakdown in the quartz ampoule.

In the above process, the movement from the first step heat-treatment to the second step heat-treatment is carried out by taking the wafers 1 out of the quartz ampoule 2 once, then placing the wafers in another quartz ampoule 2 and evacuating a gas in the ampoule again. However, the movement from the first step heat-treatment to the second step heat-treatment may be carried out directly while the wafers 1 are sealed in the same quartz ampoule 2, by using a horizontal furnace having two temperature zones, and by controlling the phosphorous vapor pressure in the ampoule to a predetermined one by adjusting the temperature of an end of the ampoule 2.

Next, the gist of the present invention will become more fully understood from the following concrete preferred examples, however, these examples are not intended as a definition of the limits of the present invention.

EXAMPLE 1

An undoped InP single crystal ingot having Fe concentration of 0.03 ppmw and a concentration not more than 0.005 ppmw for Co and Cr (the lower limit of resolution of analyzer) was grown from a raw InP polycrystal by the Liquid encapsulated Czochralski method, and sliced to make a large number of wafers 1 having a thickness of 0.5 mm. In each of a plurality of quartz ampoules 2, 30 InP wafers 1 were aligned at approximately equal intervals by using a jig 4 made of quartz, as shown in FIG. 1. Proper amounts of red phosphorus 3 having a purity of 7 N were placed in each quartz ampoule 2 and a gas in the ampoule was evacuated so that the pressure therein was $1 \times 10^{-6}$ Torr. Thereafter, the open end of the quartz ampoule 2 was melted by an oxyhydrogen burner to seal the quartz ampoule. The amount of the red phosphorus 3 was adjusted so that the partial pressure of phosphorus ($P_4$) in the ampoule 2 was 1 atm at each of annealing temperatures of 910° C., 925° C., 940° C., 950° C., 960° C., 970° C., 980° C., and 990° C. Then, the quartz ampoules 2 were set in a horizontal furnace 6 one by one, heated by a heater 5 and held at the respective annealing temperatures for 40 hours. This corresponds to the first step heat-treatment. Thereafter, the InP wafers 1 in the quartz ampoules 2 were cooled to the room temperature with a cooling rate of 2° C./min and were taken out of the quartz ampoule 2.

After annealing, the resistivity and mobility on the surface of each of (001)-oriented InP wafers were measured along the <110> orientation by the three electrode guard method (Hall measurement). Each interval for measurement was 100 μm, and the number of the measured points were 401.

Figure 2:
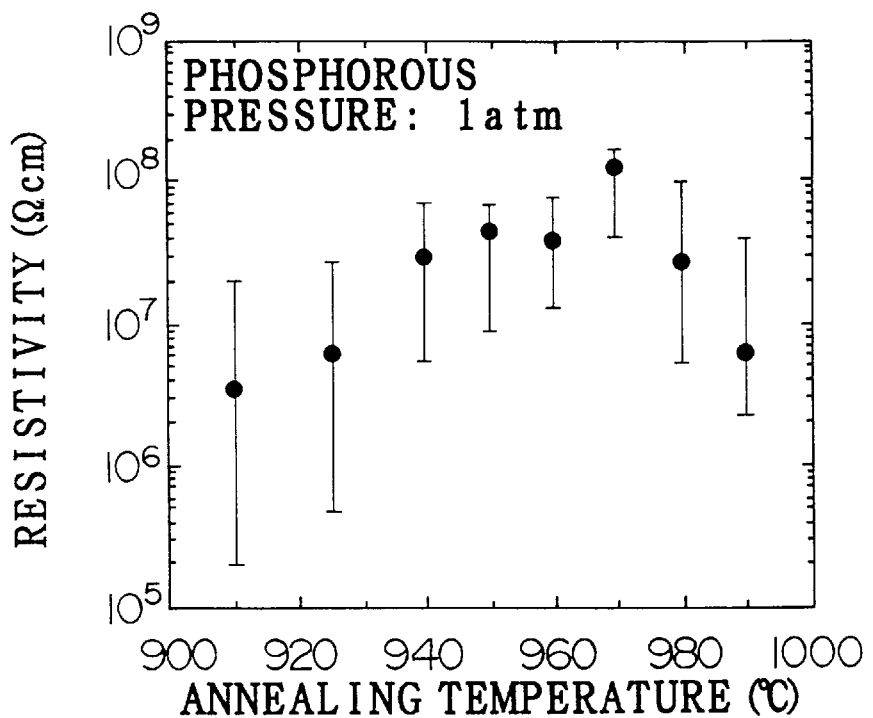
FIG. 2 is a graph for showing the relationship between the annealing temperature and the resistivity of an InP wafer produced by the first embodiment of the invention.
Figure 3:
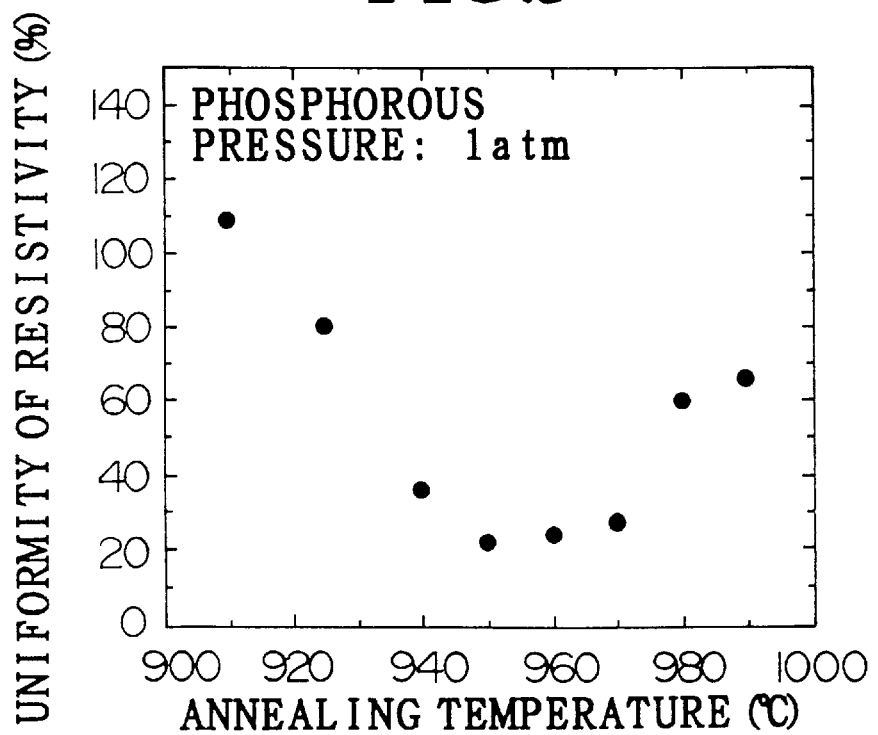
FIG. 3 is a graph for showing the relationship between the annealing temperature and the uniformity of resistivity in an InP wafer produced by the first embodiment of the invention.
Figure 4:
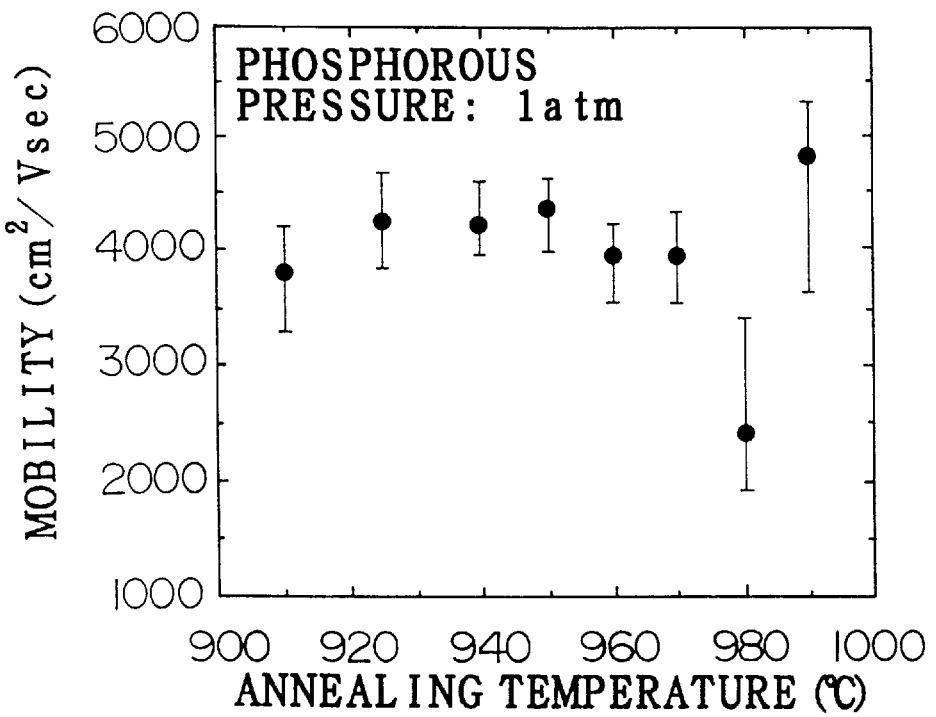
FIG. 4 is a graph for showing the relationship between the annealing temperature and the mobility of an InP wafer produced by the first embodiment of the invention.
Figure 5:
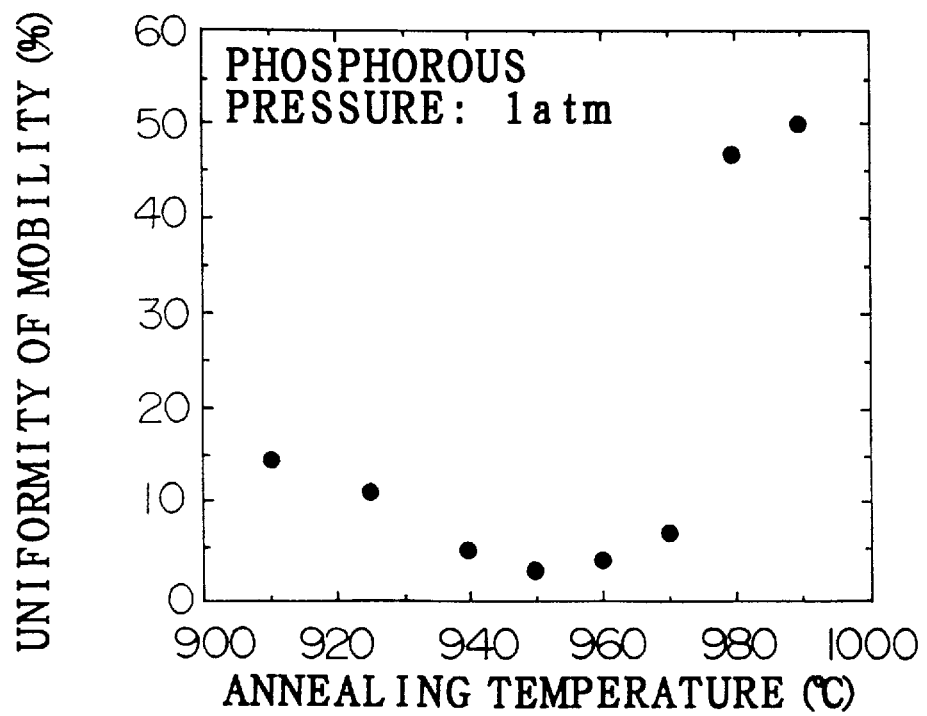
FIG. 5 is a graph for showing the relationship between the annealing temperature and the uniformity of mobility in an InP wafer produced by the first embodiment of the invention.

The results of the measurement are illustrated in FIGS. 2–5. FIGS. 2 and 4 show the resistivities and mobilities of the InP wafer, respectively. In the Figures, each error-bar denotes a variation in the wafer. FIGS. 3 and 5 show the uniformity of resistivities and the uniformity of mobilities in the wafer, respectively. From these Figures, it was confirmed that the annealing temperature in the range of 940–990° C. produced a semi-insulating InP single crystal of a resistivity of $10^6$ Ω·cm to $2 \times 10^8$ Ω·cm. It is presumed that even an annealing temperature of 930° C. would produce a semi-insulating InP single crystal because of the resistivity of InP of not less than $10^6$ Ω·cm. It is understood that the annealing temperature of not less than 940° C. nor more than 970° C. can reduce the uniformity of resistivities and that of mobilities in an InP wafer after the first step heat-treatment.

EXAMPLE 2

In each of a plurality of quartz ampoules 2, 30 InP wafers 1 which were made by slicing an InP ingot obtained in the same manner as the Example 1, were aligned at approximately equal intervals by using a jig 4 made of quartz, as shown in FIG. 1.

Proper amounts of red phosphorus 3 having a purity of 7 N were placed in each quartz ampoule 2 and a gas in the ampoule was evacuated so that the pressure therein was $1 \times 10^{-6}$ Torr. Thereafter, the open end of the quartz ampoule 2 was melted by an oxyhydrogen burner to seal the quartz ampoule. The amount of the red phosphorus 3 was adjusted so that the partial pressure of phosphorus in the ampoule 2 was 1 atm at an annealing temperature of 950° C. Then, the quartz ampoules 2 were set in a horizontal furnace 6 one by one, heated by a heater 5 and held at 950° C. for 40 hours. This corresponds to the first step heat-treatment. Thereafter, the InP wafers 1 in the quartz ampoules 2 were cooled to the room temperature with a cooling rate of 2° C./min and were taken out of the quartz ampoules 2.

The resistivities and mobilities in several InP wafers were measured by a Hall measurement. As a result, the resistivity in each wafer was in the range of $8.2 \times 10^6$ Ω·cm to $3.5 \times 10^7$ Ω·cm and the variation thereof was in the range of 22.5–53.7%. The mobility in each wafer was in the range of 3,750–4,600 cm$^2$/V·s and the variation thereof was in the range of 3.0–35%.

Subsequently, the wafers 1 and proper amounts of red phosphorus 3 having a high purity were placed in other plural quartz ampoules 2 and gas in the ampoules were evacuated. The amounts of the red phosphorus 3 were adjusted so that the phosphorous vapor pressures in the ampoules 2 were respectively 0.5 atm, 1 atm, 5 atm, 10 atm, 15 atm, 30 atm, 40 atm and 50 atm at an annealing temperature of 807° C. Then, the quartz ampoules 2 were set in a horizontal furnace 6, heated and held at a 807° C. for a predetermined time. This corresponds to the second step heat-treatment. Thereafter, the InP wafers 1 in the quartz ampoules 2 were cooled to the room temperature with a cooling rate of 2° C./min and were taken out of the quartz ampoules 2.

The resistivities and mobilities in each obtained InP wafer 1 were measured by a Hall measurement.

Figure 6:
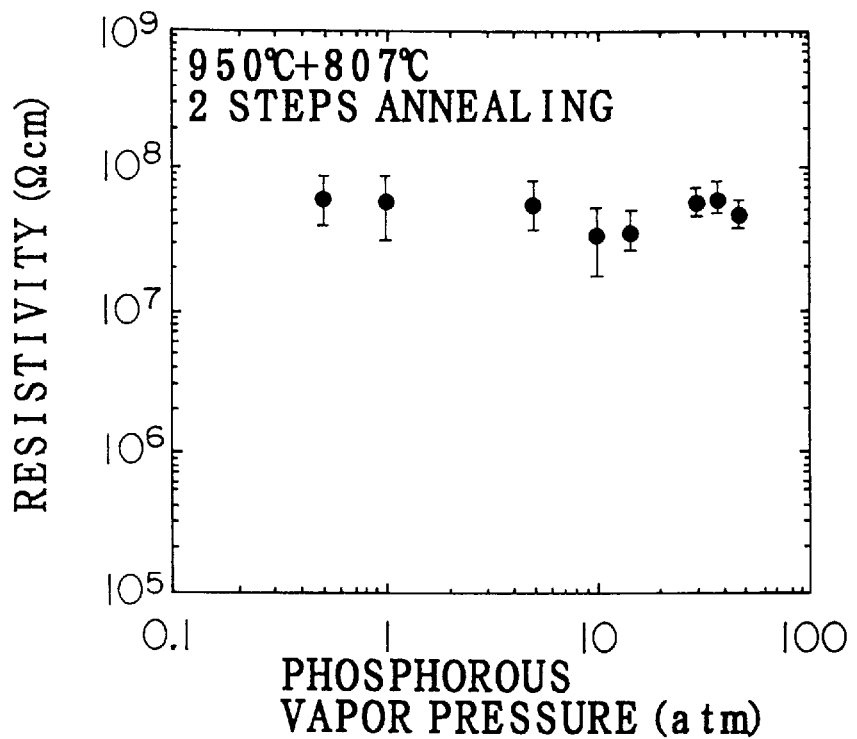
FIG. 6 is a graph for showing the relationship between the phosphorous vapor pressure and the resistivity of an InP wafer produced by the second embodiment of the invention.
Figure 7:
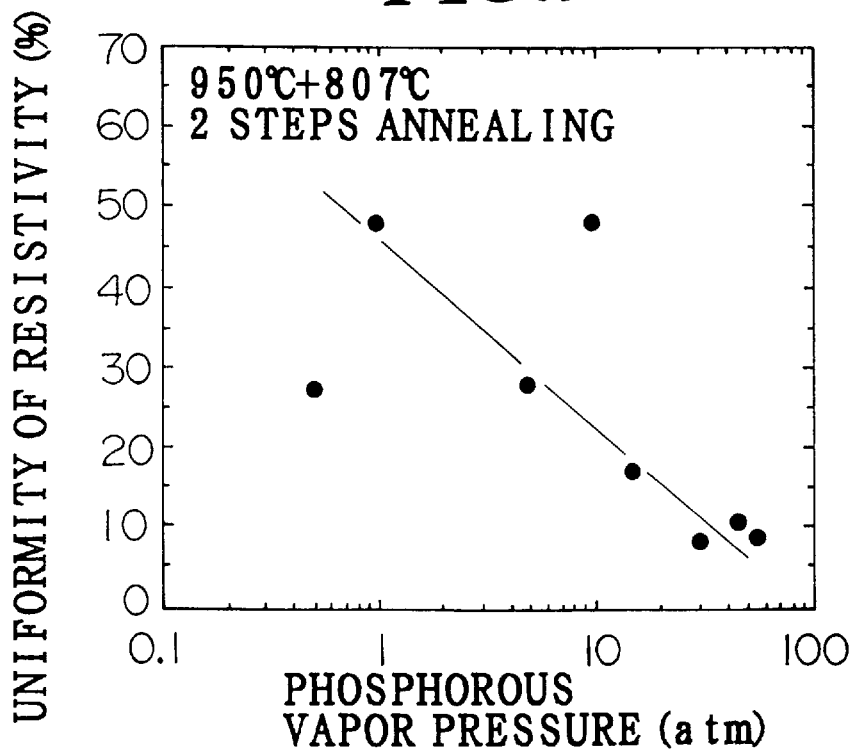
FIG. 7 is a graph for showing the relationship between the phosphorous vapor pressure and the uniformity of resistivity in an InP wafer produced by the second embodiment of the invention.
Figure 8:
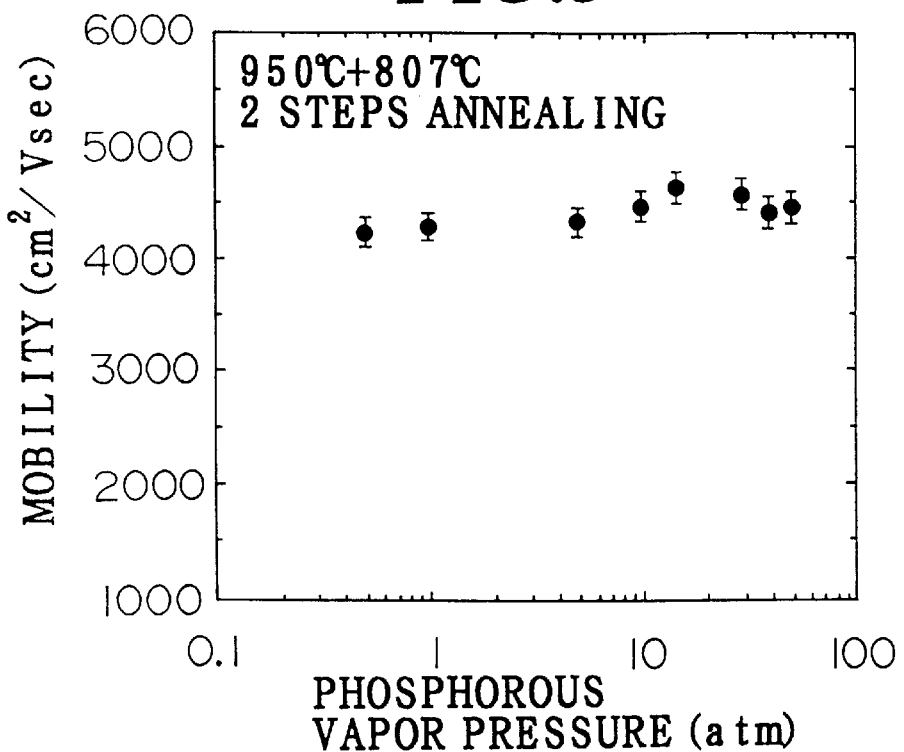
FIG. 8 is a graph for showing the relationship between the phosphorous vapor pressure and the mobility of an InP wafer produced by the second embodiment of the invention.
Figure 9:
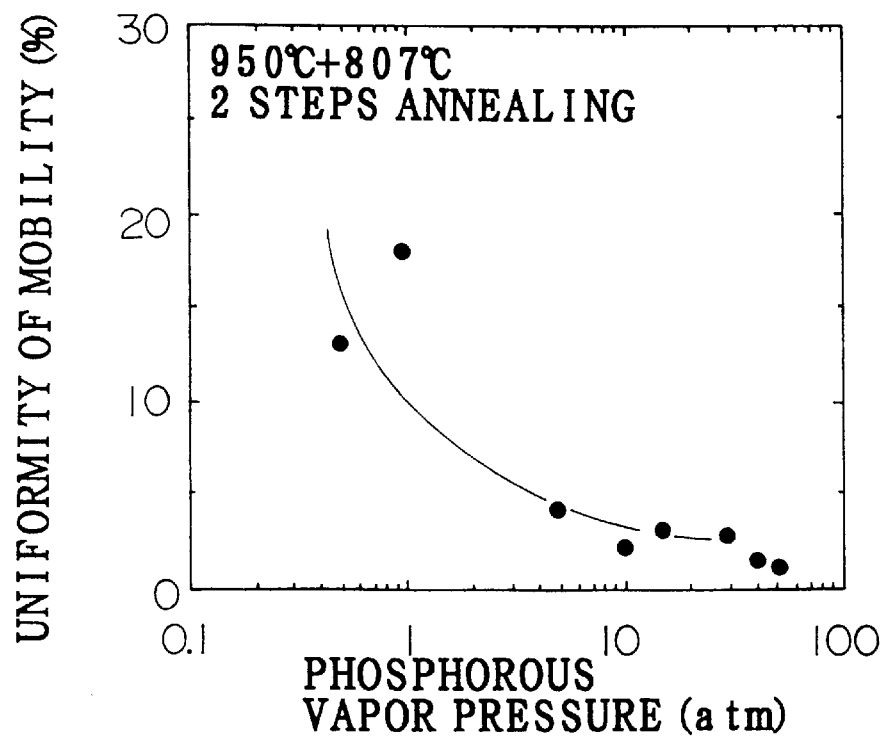
FIG. 9 is a graph for showing the relationship between the phosphorous vapor pressure and the uniformity of mobility in an InP wafer produced by the second embodiment of the invention.

The results of the measurement are illustrated in FIGS. 6–9. FIGS. 6 and 8 show the relationships between the phosphorous vapor pressure for the second step heat-treatment and the resistivities in the wafer and between the phosphorous vapor pressure for the second step heat-treatment and the mobilities in the wafer, respectively. In the Figures, each error-bar denotes a variation in a wafer. FIGS. 7 and 9 show the uniformity of resistivities and the uniformity of mobilities in the wafer, respectively.

From these Figures, it was confirmed that the phosphorous vapor pressure for the second step heat-treatment of not less than 5 atm produced a semi-insulating InP single crystal having a uniformity of mobilities of not more than 10%, and the phosphorous vapor pressure for the second step heat-treatment of not less than 15 atm produced a semi-insulating InP single crystal having a uniformity of resistivities of not more than 20%. The phosphorous vapor pressure for the second step heat-treatment is preferably not more than 50 atm because the phosphorous vapor pressure more than 50 atm has no considerable improvement in the uniformity of the resistivities and lowers the industrial productivity of the process.

EXAMPLE 3

An undoped InP single crystal ingot of Fe concentration of 0.03 ppmw and a concentration not more than 0.005 ppmw for Co and Cr (the lower limit of resolution of analyzer) was grown from a raw InP polycrystal by the Liquid encapsulated Czochralski method, and sliced to make a large number of wafers 1 having a thickness of 0.5 mm. In each of a plurality of quartz ampoules 2, 30 InP wafers 1 were aligned at approximately equal intervals by using a jig 4 made of quartz, as shown in FIG. 1. Proper amounts of red phosphorus 3 having a purity of 6 N were placed in each quartz ampoule 2 and a gas in the ampoule was evacuated so that the pressure therein was $1 \times 10^{-6}$ Torr. Thereafter, the open end of the quartz ampoule 2 was melted by an oxyhydrogen burner to seal the quartz ampoule. The amount of the red phosphorus 3 was adjusted so that the partial pressure of phosphorus ($P_4$) in the ampoule 2 was 1 atm at an annealing temperature of 950° C. Then, the quartz ampoules 2 were set in a horizontal furnace 6 one by one, heated by a heater 5 and held at an annealing temperature of 950° C. for 6, 12, 16, 20 and 40 hours respectively. This corresponds to the first step heat-treatment. Thereafter, the InP wafers 1 in the quartz ampoules 2 were cooled to the room temperature with a cooling rate of 2° C./min and were taken out of the quartz ampoule 2.

After annealing, the resistivities and the uniformity of resistivities in each of (001)-oriented InP wafers were measured along the <110> orientation by the three-electrode guard method.

Figure 10:
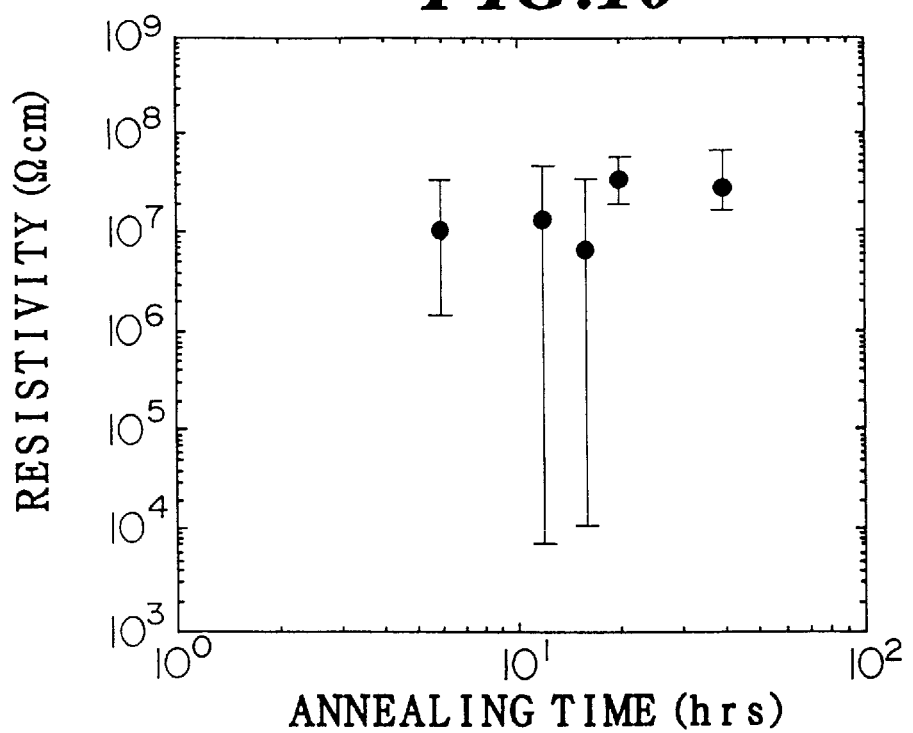
FIG. 10 is a graph for showing the relationship between the annealing time and the resistivity of an InP wafer after the first step heat-treatment according to the third embodiment of the invention.
Figure 11:
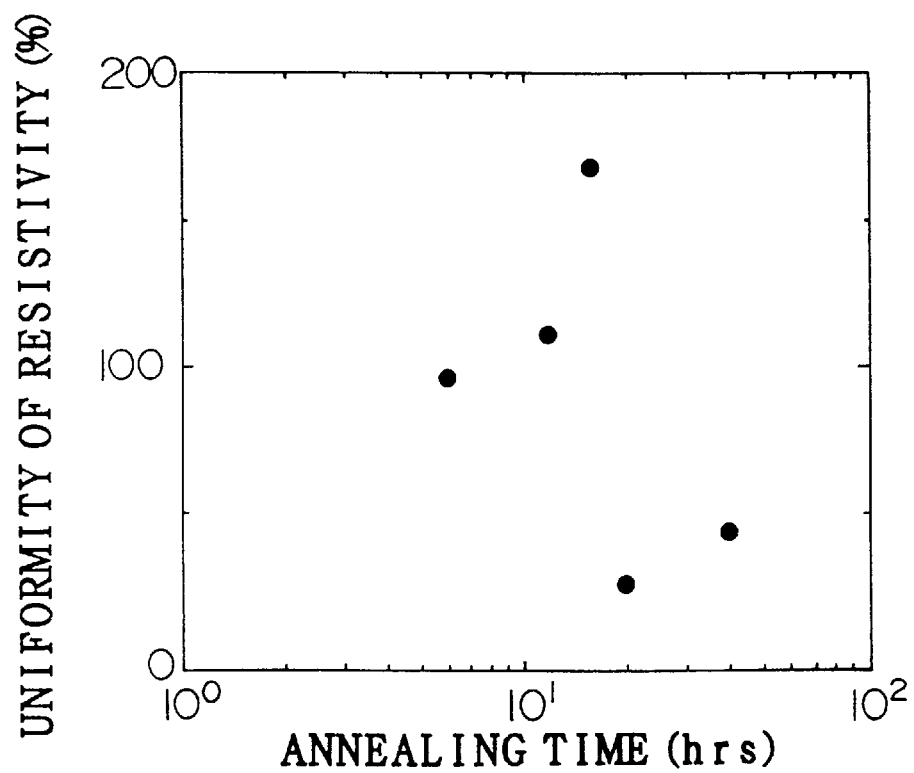
FIG. 11 is a graph for showing the relationship between the annealing time and the uniformity of resistivity in an InP wafer after the first step heat-treatment according to the third embodiment of the invention.

The results of the measurement, that is, the relationships between the annealing time and the resistivity in the InP wafer and between the annealing time and the uniformity of resistivities in the InP wafer, after the first step heat-treatment according to the third embodiment are illustrated in FIGS. 10 and 11, respectively. In these Figures, the uniformity of resistivities in each InP wafer was determined by calculating the standard deviation and the average value on the basis of the value at each point on the surface of the wafer and by calculating the percentages of the ratio thereof. From these graphs, it was confirmed that semi-insulation of InP single crystal having a resistivity not less than $10^6$ Ω·cm required an annealing time not less than 20 hours. In this case, the uniformity of resistivities in the wafer was about 20–60%.

EXAMPLE 4

In each of a plurality of quartz ampoules 2, 30 InP wafers 1 which were made by slicing an InP ingot obtained in the same manner as the Example 1, were aligned at approximately equal intervals by using a jig 4 made of quartz, as shown in FIG. 1. Proper amounts of red phosphorus 3 having a purity of 7 N were placed in each quartz ampoule 2 and a gas in the ampoule was evacuated so that the pressure therein was $1 \times 10^{-6}$ Torr.

Thereafter, the open end of the quartz ampoule 2 was melted by an oxyhydrogen burner to seal the quartz ampoule. The amount of the red phosphorus 3 was adjusted so that the partial pressure of phosphorus in the ampoule 2 was 1 atm at an annealing temperature of 950° C. Then, the quartz ampoules 2 were set in a horizontal furnace 6 one by one, heated by a heater 5 and held at 950° C. for 40 hours. This corresponds to the first step heat-treatment. Thereafter, the InP wafers 1 in the quartz ampoules 2 were cooled to the room temperature with a cooling rate of 2° C./min and were taken out of the quartz ampoules 2.

Figure 12:
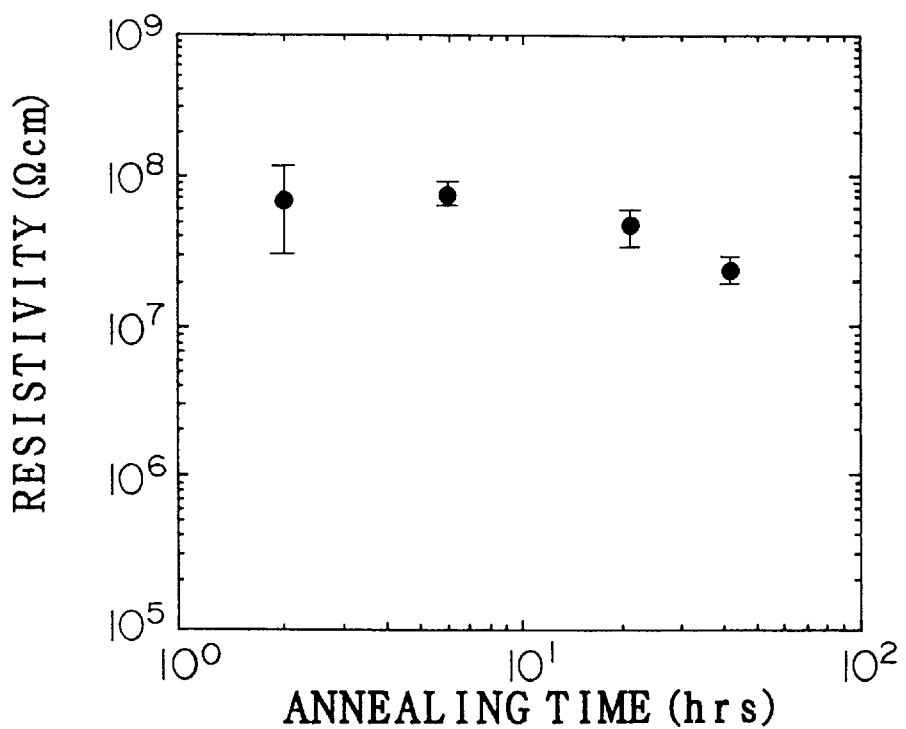
FIG. 12 is a graph for showing the relationship between the annealing time and the resistivity of an InP wafer after the second step heat-treatment according to the fourth embodiment of the invention.
Figure 13:
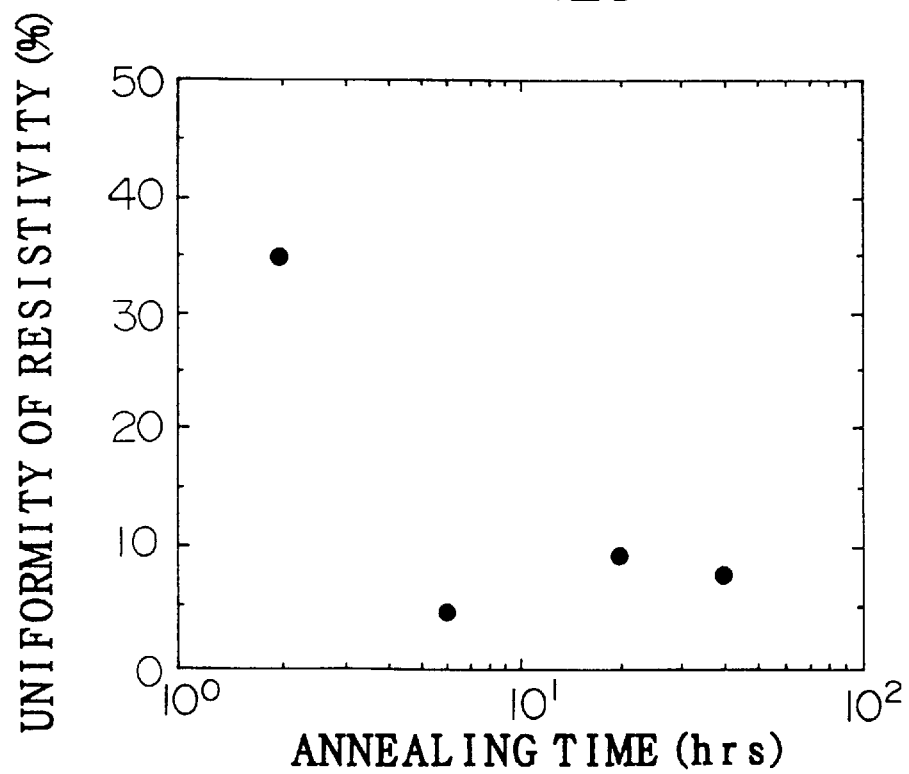
FIG. 13 is a graph for showing the relationship between the annealing time and the uniformity of resistivity in an InP wafer after the second step heat-treatment according to the fourth embodiment of the invention.

The resistivities and mobilities in several InP wafers were measured by a Hall measurement. The results of the measurement are shown in FIGS. 12 and 13. FIG. 12 shows the relationship between the annealing time for the second step heat-treatment and the resistivities in the heat-treated wafer. FIG. 13 shows the uniformity of resistivities in the wafer according to this step. From these graphs, it is found that the semi-insulating InP single crystal wafers were semi-insulated independently of the annealing time in the second step heat-treatment, and the uniformity of the resistivities in the wafer not more than 5.0% was obtained when the annealing time was 6 hours and the uniformity of resistivities in the wafer not more than 10% was obtained when the annealing time in the second step heat-treatment was not less than 6 hours nor more than 20 hours. However, when the annealing time in the second step heat-treatment was short, i.e., about 2 hours, the uniformity of resistivities in the wafer could not be reduced, that is, a large uniformity of resistivities in the wafer of 35% was obtained. When the annealing time in the first step heat-treatment was not less than 20 hours nor more than 40 hours and the annealing time in the second step heat-treatment was not less than 6 hours nor more than 20 hours, the uniformity of mobilities in the wafer not more than 10% was obtained.

The process for producing a semi-insulating InP single crystal according to the present invention, comprises: a first step heat-treatment for heating an undoped InP single crystal having a concentration of a residual impurity of not more than 0.05 ppmw containing at least one of Fe, Co and Cr, at a temperature of not less than 930° C. and less than 1000° C. in an atmosphere of phosphorous vapor pressure in the ampoule which is not less than a dissociation pressure of InP in equilibrium at the temperature and which is not more than 15 atm, preferably, more than 0.5 atm and less than 10 atm, more preferably, more than 1.0 atm and less than 5 atm; and a second step heat-treatment for thereafter heating the InP single crystal at a temperature of not less than 662° C. and less than 900° C. in an atmosphere of phosphorous vapor pressure in the ampoule which is not less than 5 atm nor more than 50 atm, preferably, not less than 15 atm nor more than 50 atm. Consequently, according to the method of the invention, it is possible to produce a semi-insulating InP single crystal having good uniformity of resistivities and that of mobilities in the InP single crystal wafer, in particular, to produce a semi-insulating InP single crystal wafer which has both a uniformity of mobilities not more than 10% in the wafer and a uniformity of resistivities not more than 20% in the wafer.

The present invention and the above-described effects according to the invention were reported by the inventors et al. in "Reproducibility in the Fabrication of Undoped Semi-Insulating InP", Proceedings of 8th International Conference on InP and Related Materials, p43–46 (1996).

What is claimed is:

1. A process for producing a semi-insulating InP single crystal having a uniformity of mobility not more than 10% in the single crystal and a uniformity of resistivity not more than 20% in the single crystal, comprising:

a first step heat-treatment for heating an undoped InP single crystal having a concentration of a residual impurity of not more than 0.05 ppmw containing at least one of Fe, Co and Cr, at a temperature of not less than 930° C. and less than 1000° C. in an atmosphere of phosphorous vapor pressure in the ampoule which is not less than 1 atm and less than 5 atm in order to semi-insulate the InP single crystal; and a second step heat-treatment for thereafter heating the InP single crystal at a temperature of not less than 662° C. and less than 900° C. in an atmosphere of phosphorous vapor pressure in the ampoule which is not less than 5 atm nor more than 50 atm in order to improve a uniformity of electrical properties in the InP single crystal.

2. The process for producing a semi-insulating InP single crystal as claimed in claim 1, wherein the phosphorous vapor pressure in the second step heat-treatment is not less than 15 atm nor more than 50 atm.

3. The process for producing a semi-insulating InP single crystal as claimed in claim 1, wherein the temperature for heat-treatment in the first step heat-treatment is not less than 940° C. nor more than 970° C.

4. A process for producing a semi-insulating InP single crystal having a uniformity of mobility not more than 10% in the single crystal and a uniformity of resistivity not more than 20% in the single crystal, comprising:

a first step heat-treatment for heating an undoped InP single crystal having a concentration of a residual impurity of 0.05 ppmw or less containing at least one of Fe, Co and Cr, at a temperature of not less than 930° C. and less than 1000° C. in an atmosphere of phosphorous vapor pressure in the ampoule which is not less than 1 atm and less than 5 atm in order to semi-insulate the InP single crystal; and a second step heat-treatment for thereafter heating the InP single crystal at a temperature of not less than 662° C. and less than 900° C. in an atmosphere of phosphorous vapor pressure in the ampoule which is not less than 5 atm in order to improve a uniformity of electrical properties in the InP single crystal.

5. A process for producing a semi-insulating InP single crystal having a uniformity of mobility not more than 10% in the single crystal and a uniformity of resistivity not more than 20% in the single crystal, comprising:

a first step heat-treatment for heating an undoped InP single crystal having a concentration of a residual impurity of 0.05 ppmw or less containing at least one of Fe, Co and Cr, at a temperature of not less than 930° C. and less than 1000° C. in an atmosphere of phosphorous vapor pressure in the ampoule which is not less than 1 atm and less than 5 atm for not less than 20 hours in order to semi-insulate the InP single crystal; and a second step heat-treatment for thereafter heating the InP single crystal at a temperature of not less than 662° C. and less than 900° C. in an atmosphere of phosphorous vapor pressure in the ampoule which is not less than 5 atm for not less than 6 hours in order to improve a uniformity of electrical properties in the InP single crystal.

6. The process for producing a semi-insulating InP single crystal as claimed in claim 5, wherein the first step heat-treatment is carried out for not less than 20 hours nor more than 40 hours; and the second step heat-treatment is carried our in an atmosphere of phosphorous vapor pressure in the ampoule which is not less than 5 atm nor more 50 atm for not less than 6 hours nor more than 40 hours.

7. The process for producing a semi-insulating InP single crystal as claimed in claim 5, wherein the phosphorous vapor pressure in the second step heat-treatment is not less than 15 atm nor more than 50 atm.

8. The process for producing a semi-insulating InP single crystal as claimed in claim 5, wherein the temperature for heat-treatment in the first step heat-treatment is not less than 940° C. nor more than 970° C.

* * * * *